(12) United States Patent
Ginetti et al.

(10) Patent No.: US 9,141,746 B1
(45) Date of Patent: Sep. 22, 2015

(54) SYSTEM AND METHOD TO DRAG INSTANCE MASTER PHYSICAL SHELL

(71) Applicant: Cadence Design Systems, Inc., San Jose, CA (US)

(72) Inventors: Arnold Ginetti, Antibes (FR); Jean-Noel Pic, Valbonne (FR); Stephane Berger, Roquefort les Pins. (FR)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 14/231,578

(22) Filed: Mar. 31, 2014

(51) Int. Cl.
*G06F 17/50* (2006.01)
*G06F 3/0484* (2013.01)

(52) U.S. Cl.
CPC ........ *G06F 17/5068* (2013.01); *G06F 3/04845* (2013.01); *G06F 17/5072* (2013.01)

(58) Field of Classification Search
CPC .......................... G06F 17/5068; G06F 17/5072
USPC .......................................................... 716/139
See application file for complete search history.

(56) References Cited

U.S. PATENT DOCUMENTS

| | | | | |
|---|---|---|---|---|
| 5,974,243 A * | 10/1999 | Moh et al. | ......................... | 716/52 |
| 6,045,584 A * | 4/2000 | Benzel et al. | ................... | 716/122 |
| 6,557,162 B1 * | 4/2003 | Pierrat | ............................. | 716/55 |
| 6,968,527 B2 * | 11/2005 | Pierrat | ............................... | 430/5 |
| 7,117,473 B1 * | 10/2006 | Knol et al. | ..................... | 716/124 |
| 7,120,892 B1 * | 10/2006 | Knol et al. | ..................... | 716/124 |
| 7,146,595 B2 * | 12/2006 | Knol et al. | ..................... | 716/119 |
| 7,418,686 B1 * | 8/2008 | Knol et al. | ..................... | 716/118 |
| 7,543,261 B2 * | 6/2009 | Lindberg et al. | .............. | 716/119 |
| 7,543,262 B2 * | 6/2009 | Wang et al. | ..................... | 716/119 |
| 7,546,571 B2 * | 6/2009 | Mankin et al. | ................. | 716/137 |
| 7,698,665 B2 * | 4/2010 | Abrams et al. | ................... | 716/55 |
| 7,865,850 B1 * | 1/2011 | Kao et al. | ..................... | 716/136 |
| 7,865,857 B1 * | 1/2011 | Chopra et al. | ................. | 716/119 |
| 8,046,730 B1 * | 10/2011 | Ferguson et al. | ............. | 716/139 |
| 8,082,531 B2 * | 12/2011 | Ogami et al. | ................. | 716/117 |
| 8,099,708 B2 * | 1/2012 | Lindberg et al. | .............. | 716/139 |
| 8,473,891 B1 * | 6/2013 | Bosshart | ....................... | 716/139 |
| 8,499,270 B1 * | 7/2013 | Best et al. | ..................... | 716/117 |
| 8,584,077 B1 * | 11/2013 | Kumar et al. | ................. | 716/139 |
| 8,635,567 B1 * | 1/2014 | Seng et al. | .................... | 716/106 |
| 8,650,517 B1 * | 2/2014 | Sundararajan et al. | ........ | 716/104 |
| 8,689,169 B2 * | 4/2014 | Fischer et al. | ................. | 716/139 |
| 2002/0013933 A1 * | 1/2002 | Shiba | ............................... | 716/4 |
| 2005/0172252 A1 * | 8/2005 | Cheng et al. | .................... | 716/10 |
| 2005/0198605 A1 * | 9/2005 | Knol et al. | ....................... | 716/11 |
| 2005/0204315 A1 * | 9/2005 | Knol et al. | ......................... | 716/2 |
| 2006/0053401 A1 * | 3/2006 | McElvain et al. | ............... | 716/11 |
| 2006/0095882 A1 * | 5/2006 | Mankin et al. | ................... | 716/11 |
| 2006/0248491 A1 * | 11/2006 | Lindberg et al. | ................ | 716/11 |
| 2007/0130553 A1 * | 6/2007 | Wang et al. | ...................... | 716/11 |
| 2007/0250800 A1 * | 10/2007 | Keswick | .......................... | 716/8 |
| 2008/0028356 A1 * | 1/2008 | Aoki et al. | ....................... | 716/18 |
| 2008/0098343 A1 * | 4/2008 | Dubey et al. | ..................... | 716/11 |
| 2010/0205576 A1 * | 8/2010 | Majumder et al. | .............. | 716/18 |

(Continued)

*Primary Examiner* — Stacy Whitmore
(74) *Attorney, Agent, or Firm* — Sawyer Law Group, P.C.

(57) ABSTRACT

A system and method for enabling the display and movement of a boundary box of an instance master inclusive of specific predetermined geometric figures, including master pins, master halo and master boundary edges, is provided. The system and method provides for improved utilization of computer resources and enables users of the present invention to be able to drag and use instance master in their designs more efficiently and rapidly.

19 Claims, 8 Drawing Sheets

(56) References Cited

U.S. PATENT DOCUMENTS

| | | | |
|---|---|---|---|
| 2010/0287519 A1* | 11/2010 | Su | 716/10 |
| 2011/0314437 A1* | 12/2011 | McIlrath | 716/139 |
| 2013/0047134 A1* | 2/2013 | Hsu et al. | 716/139 |
| 2013/0205274 A1* | 8/2013 | Bosshart | 716/139 |
| 2013/0275938 A1* | 10/2013 | Bendicksen et al. | 716/139 |

* cited by examiner

SYSTEM AND METHOD TO DRAG INSTANCE MASTER PHYSICAL SHELL

FIELD OF THE INVENTION

The present invention relates generally to graphical interfaces and designs, and more particularly relates to improving instance master rendering and utilization for improved performance.

BACKGROUND OF THE INVENTION

Technical development, such as the development of integrated circuit designs, typically relies on software-based graphical systems to enable a technical drawing or design to be created. In using such editing software, it is advantageous for a user to select an instance master of a predetermined layout within the software editor in preparation for moving it to a new location within a further particular reference frame, for a further layout or design, particularly in the case of typical electronic design automation ("EDA") software where it is used for custom digital, mixed-signal and analog designs at the device, cell, and block levels.

In a typical EDA layout software tool, after the instance master is selected from a integrated circuit layout and is begun to be moved (or dragged) by the designer, a "ghost image" appears as the selected instance master portion is now being moved, where the selected instance master portion is highlighted or otherwise presented in a manner that stands out from the rest of the integrated circuit design such that the designer can see the selected instance master portion move across the display of the EDA layout software tool. However, since the ghost image may also contain as many geometric figures as the selected instance master, when the ghost image is moved, servers and computer-supported graphics may often be challenged to failure in rendering or moving the ghost image, depending on the computing power available. One solution is to reduce the number of dragged images within the instance master such that it may be a few hundred in quantity. By reducing the number of dragged images, the resulting ghost image may be more easily moved by a designer.

Unfortunately, when the number of geometric figures selected is substantially less than the original number of geometric figures in the instance master, the content of the instance master may not appear on a designer's screen, making it difficult to move as well as accurately place an instance master to a final design location. In general, it is recognized that the graphics module in typical EDA layout software will only permit the dragging of the perimeter of the instance master and not the content of the instance master, as it is typically too processor-intensive to drag more than a thousand geometric figures of a selected instance master at any one time, even if the instance master had contained hundreds of thousands of geometric figures originally.

This limitation can create inaccuracies for a designer in the geometric placement of the instance master into other designs, the correct spacing of the instance master geometries with respect to top level geometries, etc., for example.

What is therefore desired is a method that overcomes these challenges and provides for enabling the display and movement of a boundary box (e.g., physical shell) of the instance master inclusive of specific predetermined geometric figures which are proximate to the boundary box.

SUMMARY OF THE INVENTION

The present invention fulfills these needs and has been developed in response to the present state of the art, and in particular, in response to the problems and needs in the art that have not yet been fully solved by currently available technologies.

One embodiment of the present invention provides for a method for defining an instance master to be displayed having a geometrically accurate boundary box and one or more instance master geometric figures proximate to one or more boundary edges of the boundary box. The method comprises: identifying an instance master to be displayed from a data source, determining an instance master boundary box having a plurality of boundary edges defining the geometric boundary of the instance master, identifying one or more instance master pins, and, determining an instance master halo consisting of a set of one or more geometric figures proximate to the instance master boundary box.

Another embodiment of the present invention provides for a computer-implemented method for displaying an instance master having a geometrically accurate boundary box and a plurality of instance master geometric figures proximate to boundary edges of the boundary box. The method comprises: sourcing an instance master from a data source file, defining an instance master boundary box in relation to a geometric boundary of the instance master, identifying limited content of the instance master in relation to one or more user-defined characteristics including one or more instance master pins, a master set of a plurality of geometric figures proximate to the instance master boundary box, and, displaying the instance master boundary box inclusive of the limited content.

Another embodiment of the present invention provides for a system comprising: one or more computers; and a non-transitory computer-readable medium coupled to the one or more computers having instructions stored thereon which, when executed by the one or more computers, cause the one or more computers to perform operations for defining an instance master to be electronically displayable and movable having a geometrically accurate boundary box and one or more instance master geometric figures proximate to one or more boundary edges of the boundary box. The system comprises: obtaining an instance master to be displayed from a data source, determining an instance master boundary box having a plurality of boundary edges defining the geometric boundary of the instance master, determining one or more instance master pins, and, determining an instance master halo consisting of a set of one or more geometric figures proximate to the instance master boundary box.

Other aspects and advantages of the present invention will become apparent from the following detailed description, taken in conjunction with the accompanying drawings, illustrating by way of example the principles of the invention.

DETAILED DESCRIPTION

The present invention relates generally to the display and movement of a boundary box (e.g., physical shell) of an instance master inclusive of specific predetermined geometric figures, including master pins and master boundary edges. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Figure 1:
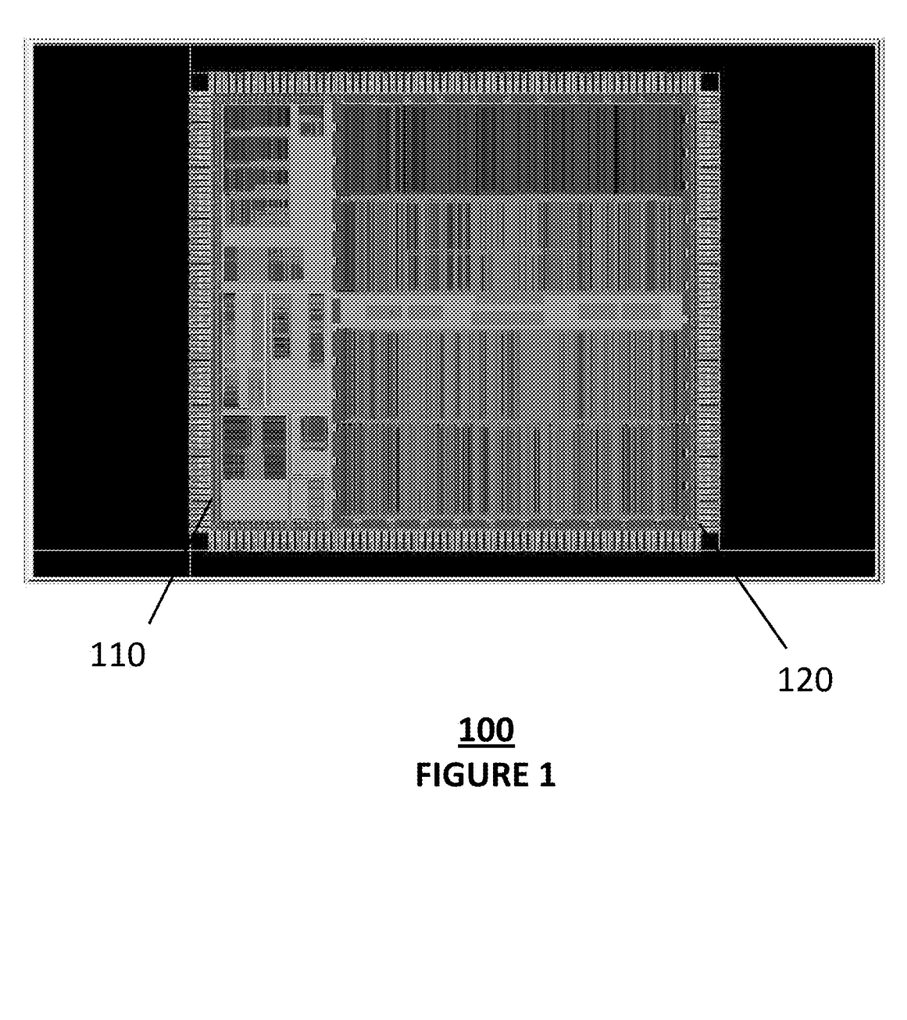
FIG. 1 depicts a screen shot of a designer preparing to move an instantiated master (also known herein as an instance) using software.

FIG. 1 depicts a screen shot 100 of a designer preparing to move an instance master using the software such as that described above. From FIG. 1, a screen shot 100 is depicted in which a designer has called a predetermined layout 110 from a database source. The predetermined layout 110 is depicted as a wire diagram in the FIG. 1, though the present invention is not so limited whereas the layout may conceivably be more or less complex, three-dimensional, include modeling analytics, and may be more or less detailed. The designer has selected a portion 120 of the predetermined layout 110. The selected portion 120 is referred to herein as the instantiated master or instance. The instance master may contain thousands or even hundreds of thousands of geometric figures within.

Figure 2:
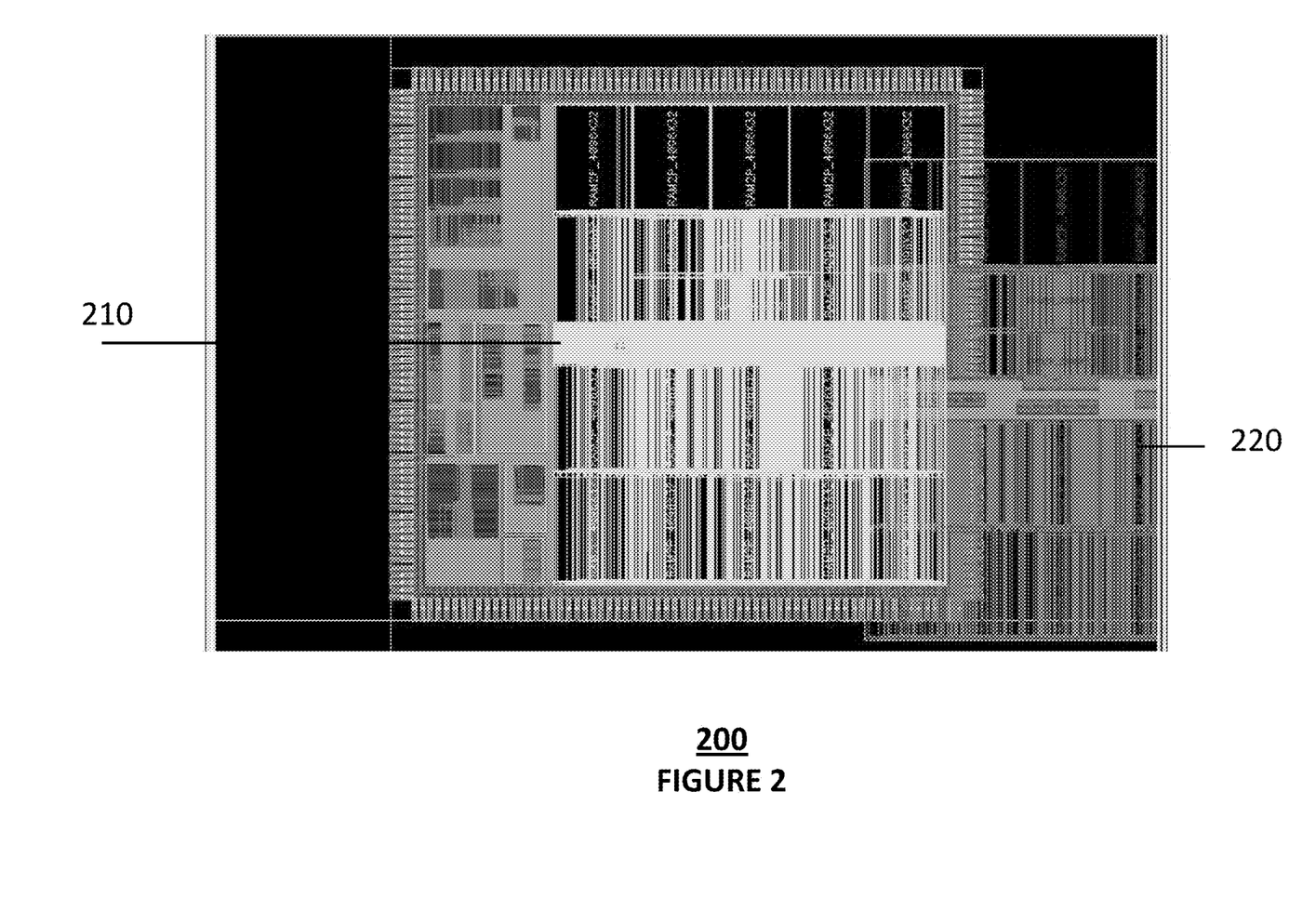
FIG. 2 depicts a screen shot of a designer moving the selected instance using software.

FIG. 2 depicts a screen shot 200 of a designer moving the selected instance master using the software such as that described above. From FIG. 2, a screen shot 200 is depicted in which the designer has begun to move the portion of the predetermined layout (also referred to as instance master) 210. After the instance master is selected and is begun to be moved (or dragged) by the designer, a "ghost image" 220 appears as the selected instance master portion is now being moved.

However, since the ghost image may also contain as many geometric figures as the selected instance, when the ghost image is moved, servers and computer-supported graphics may often be challenged to failure in rendering or moving the ghost image, depending on the computing power available. One solution is to reduce the number of images to be dragged within the instance master such that it may be a few hundred in quantity. By reducing the number of dragged images, the resulting ghost image may be more easily moved by a designer.

Figure 3:
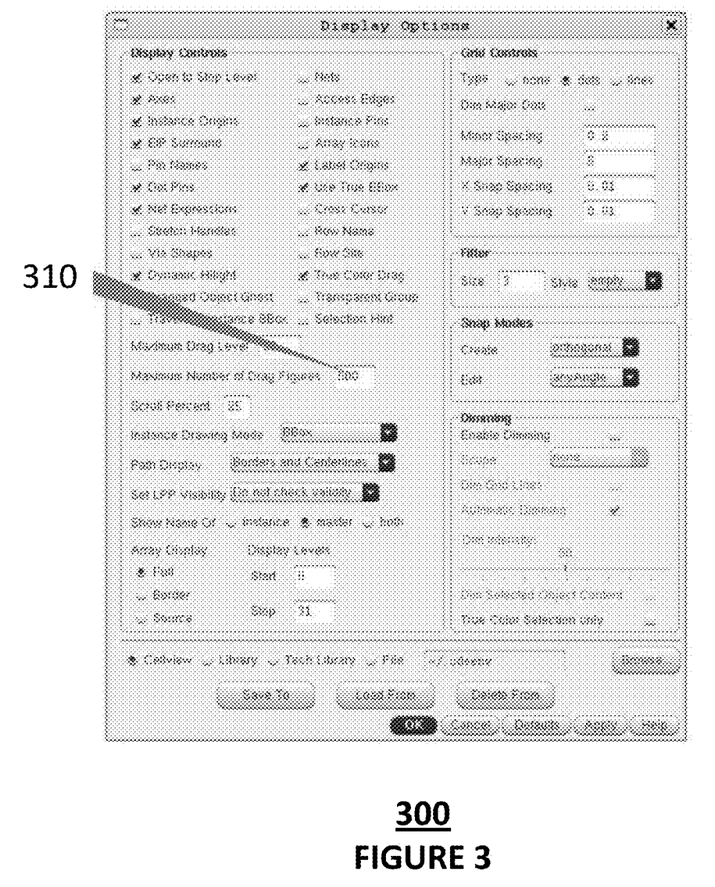
FIG. 3 sets forth an example screenshot of a software characterization table enabling the selection of the maximum number of dragged geometric figures to be included.

FIG. 3 sets forth an example screenshot 300 of a software characterization table enabling the selection of the maximum number of dragged geometric figures to be included. From FIG. 3, the display options table 300 provides for a specific limitation of a designer's choice at 310 in which the designer may specify a smaller number of geometric figures to be dragged than are in the instance master selected. In the example set forth in FIG. 3, the designer has specified a maximum of 500 geometric figures.

Unfortunately, when the maximum number of dragged geometric figures specified is substantially less than the original number of geometric figures in the instance master, the content of the instance master may not appear on a designer's screen, making it difficult to move as well as accurately place an instance master to a final design location. In general, it is recognized that the graphics software will only permit the dragging of the perimeter of the instance master and not the content of the instance master, as it is typically too processor-intensive to drag more than a thousand geometric figures of a selected instance master at any one time, even if the instance master had contained hundreds of thousands of geometric figures originally.

Figure 4:
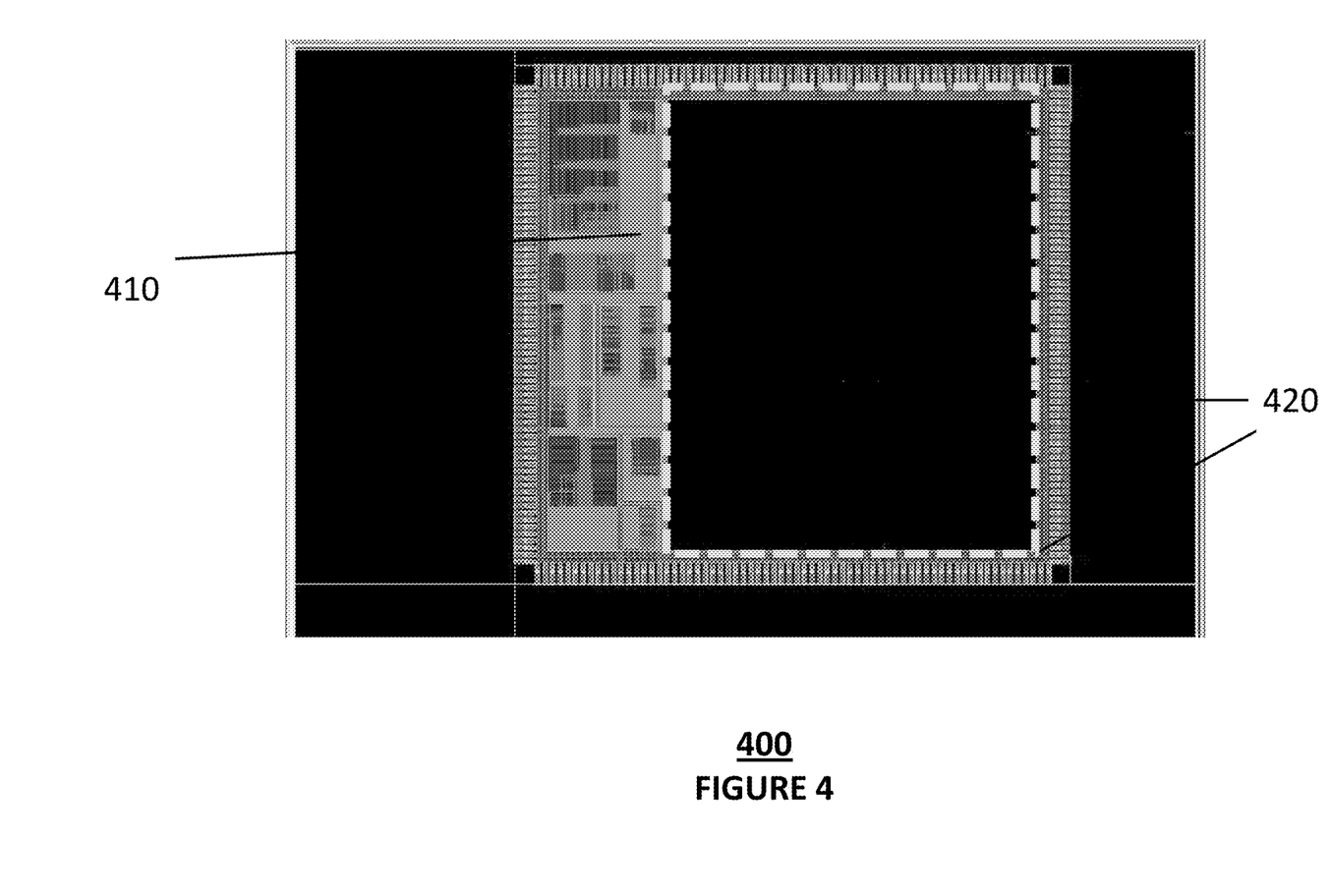
FIG. 4 depicts a screen shot of a designer preparing to move the selected instance using the software where the maximum number of images was limited.

FIG. 4 depicts a screen shot 400 of a designer preparing to move or drag the selected instance using the software where the maximum number of dragged geometric figures was limited; preferably, in one or more embodiments, FIG. 4 is a depiction based at least in part on the example described in FIG. 3. From FIG. 4, a screen shot 400 is depicted in which the designer has identified the original image 410 and selected a portion of that image as the instance master 420. However, since the maximum number of geometric figures to be dragged was limited to 500 in the scenario, such as from the designer's selection in FIG. 3, the instance master content is not visible and only the perimeter of the instance master is viewable at 420.

Figure 5:
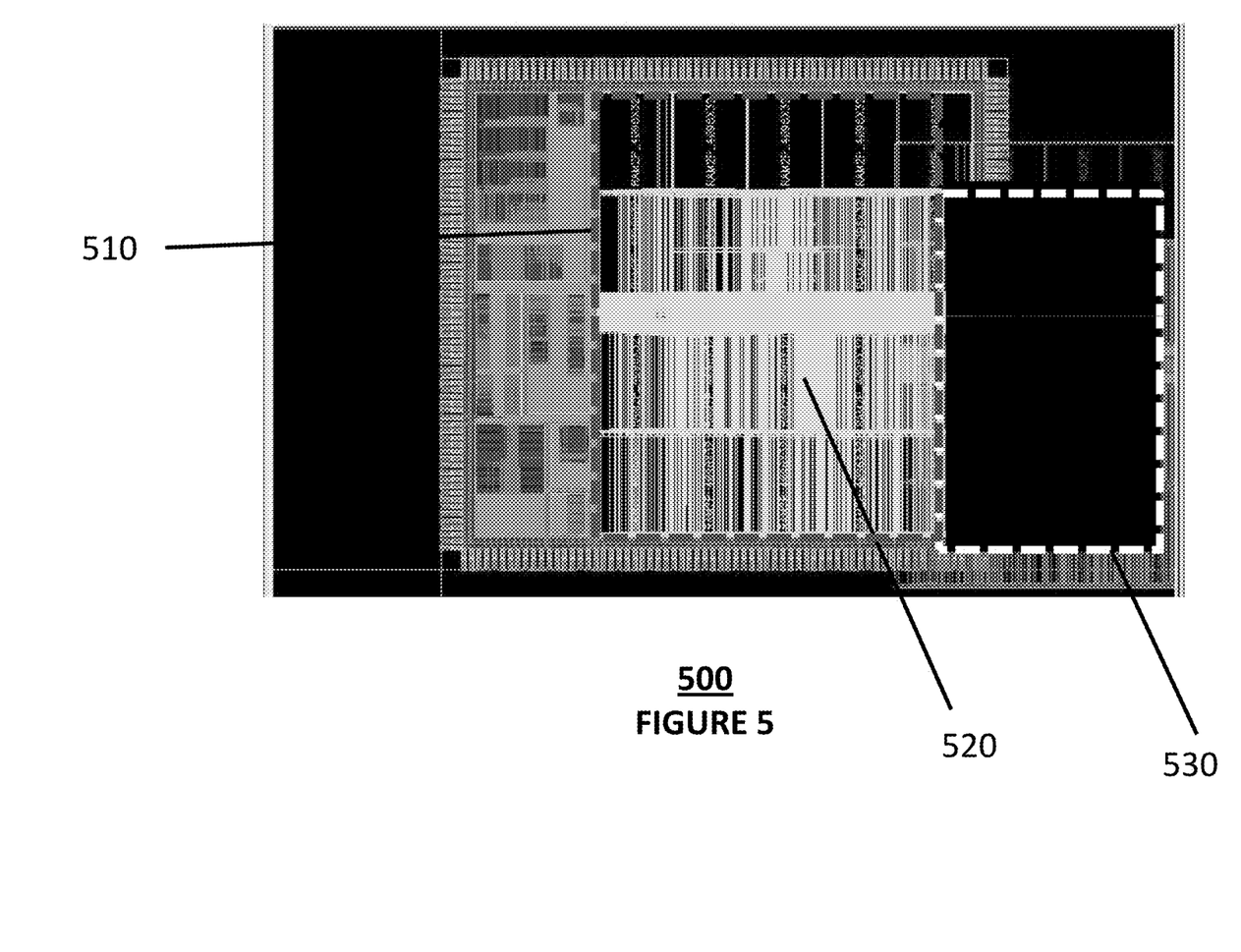
FIG. 5 depicts a screen shot for moving a selected instance in accordance with one or more embodiments of the present invention.

An objective of the present invention is to provide an instance master that is informative without the entirety of all of the geometric figures of the instance master. FIG. 5 depicts a screen shot 500 for moving a selected instance master in accordance with one or more embodiments of the present invention.

From FIG. 5, the instance 510 is selected and the instance master 520 is identified. Once the instance master 520 is identified, the instance master halo 530 is composed of many geometric figures within the instance master dose enough to the instance master boundary is identified. As used here, the instance master halo is thus composed of many possible geometric figures within the instance master such as pins, shapes, or sub-instances, which are close to the instance master boundary. The closeness of the geometric figures to the instance master boundary in one embodiment may be based upon a default value which is in turn is based upon an instance master halo width for of a given process node. By tying the halo width to a particular process node the number of geometric figures within the same area would appear consistent across process nodes. Therefore in an advanced process node, for example a 14 nm process node, one would appear to drag the same number of geometric figures as a mature process node such as a 65 nm process node. By adapting the halo width to the process node, the number of dragged geometric figures is kept more or less constant regardless of the size of the process node thereby keeping the number of geometric figures within an instance master halo constant.

In an embodiment a control is provided on the software characterization table of FIG. 3 to such that the width of a given instance master halo is advantageously defined by the user. Once the instance master halo is defined, it is communicated to a figure dragger. The figure dragger (not shown) of the present invention thus only drags the instance master halo figures instead of the entirety of the instance master figures. The number of dragged figures is therefore dramatically reduced to a strict useful minimum. Also, as used herein, the instance master halo is also interchangeably referred to as the instance master shell.

From FIG. 5, the movement of the instance 510 to the right is displayed as the instance master halo 530. The instance master halo 530, in one or more preferred embodiments of the present invention, does not display the details of the internal content of the moved instance master. The instance master halo 530 as depicted provides for visible boundary and edge definitions which are helpful to a user such that the user is able to move, arrange and otherwise position the halo proximate to another geometric figure as desired. Accordingly, the present invention enables the user to have improved ease of use and avoids the computational burdens required in traditional systems requiring numerous geometric figures to be visibly dragged during the moving of the shell.

Figure 6:
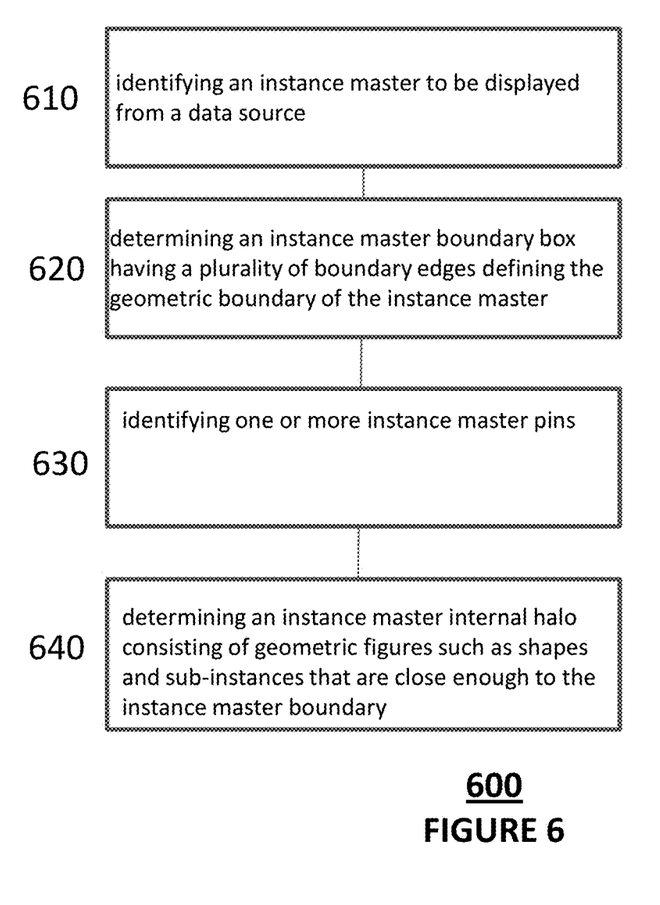
FIG. 6 depicts a flowchart of the general operation of the present invention in one or more embodiments.

FIG. 6 depicts a flowchart 600 of the general operation of the present invention in one or more embodiments. From FIG. 6, a method for defining an instance master to be displayed in accordance with the present invention is provided.

At 610, an instance master is identified as being the instance master to be displayed from a data source. In one or more preferred embodiments, the data source may be a data repository, a data base, a storage medium or any other source where electronic files suitable for the present invention may reside, locally or remotely without limitation. The file may be queried or acquired and may be of any format.

At 620, an instance master boundary box is determined. The boundary box preferably includes a plurality of boundary edges defining the geometric boundary thereof. The boundary edges, as used here, include the boundary lines or equivalent designations that reflect a specific area defining the instance master, which may include segmented boundaries or a continuous boundary such as that of an ellipse or circle shape as well, for instance. A boundary box will encompass that area of the instance master which is defined as the outer perimeter of the instance master and may be dependent upon predetermined or user-defined parameters, or may also be automatically or algorithmically defined. Similarly, the boundary box area, dimensional criteria, number of geometric figures within an area, etc., may be examples of parameters which influence the final identification of a boundary box associated with an instance master. In a preferred embodiment, the instance master physical shell is determined by performing a geometry region query in relation to the boundary edges of the instance master. A boundary box may also include only those layers specified by the user or otherwise based upon predetermined criteria.

Further user-defined parameters may include one or more of distance from an edge of the boundary box, type of geometric figure to be included, total number of geometric figures to be included, number of geometric figures to be dragged, maximum image size, and maximum amount of processing power to use, etc.

At 630, one or more instance master pins are identified, where an instance master's pins may include any of a schematic pin, a symbol pin, a pin to a geometric figure, and a user-predetermined pin, etc. A pin as used herein may connect with a geometric figure, a subassembly, a chip, an electronic component, an instance, etc.

At 640, an instance master halo is determined in much the same manner as described above with respect to FIG. 5. In an embodiment, the instance master halo includes a list of geometric figures such as pins, shapes and sub-instances that are close to the instance master boundary. In a preferred embodiment, the set of one or more geometric figures proximate to the instance master boundary box includes at least one geometric figure and is capable of including thousands, hundreds of thousands and more, though preferentially to benefit from system efficiencies and processing resources, up to a few hundred geometric figures in a set will be advantageous.

Accordingly, it will be appreciated by those skilled in the art that there are numerous variations and implementation to the flowchart of FIG. 6, each and all of which are intended to be part of the present invention. Additionally, the method of FIG. 6 may further include displaying, moving, editing, rearranging, saving and otherwise affecting the instance master. In one or more preferred embodiments, a designer may implement the present invention and move the instance master by first selecting it and then moving it (e.g., using a mouse to drag the selected instance master for instance) to a location in a predetermined file or reference frame.

The system and method provides for improved utilization of computer resources and enables users of the present invention to be able to drag and use instance master in their designs more efficiently and rapidly.

In the described embodiments, the system and method can be any circuit, software, process and/or method, including an improvement to an existing software program, for instance.

Figure 7:
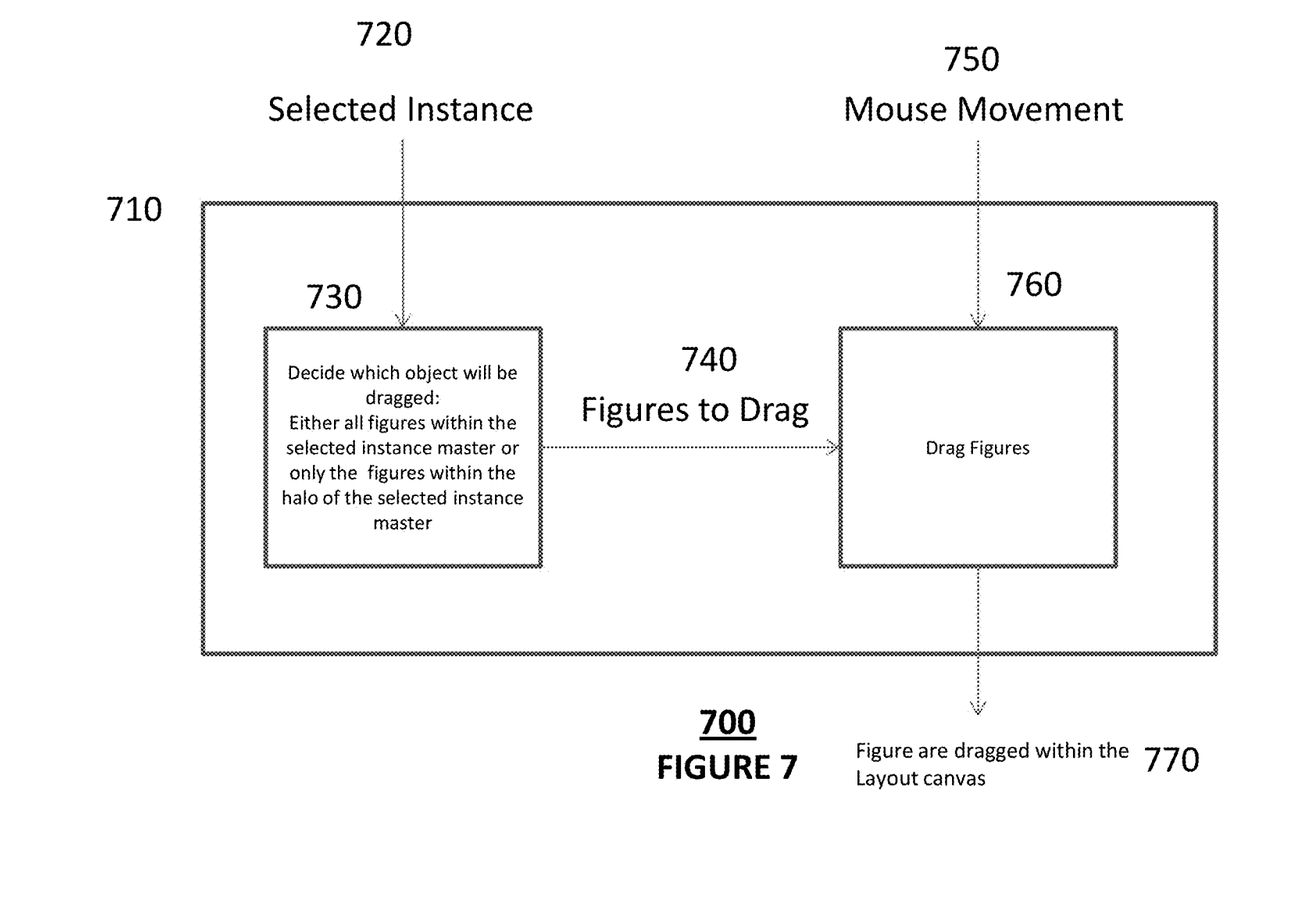
FIG. 7 illustrates the operation of the present invention, using a figure dragger approach, in accordance with one or more embodiments of the present invention.

FIG. 7 illustrates the operation of the present invention, using a figure dragger approach 700, in accordance with one or more embodiments of the present invention. From FIG. 7, the figure dragger 710 includes the activities involving those geometric figures to be dragged and the dragging, or moving, of those geometric figures within the layout. At 720, a selected instance is identified and at 730 a user decides which geometric figures of the instance are to be moved. In one or more preferred embodiments, at 730, either all figures within the instance master are selected for dragging, such as the scenario described in connection with FIG. 2, or only those figures within the halo of the selected instance master are selected for dragging, such as the scenario described in connection with FIG. 5. Based on the selected geometric figures at 730, geometric figures then selected may be dragged at 740. Using an input device such as a mouse for instance at 750, the figures to be dragged may be moved at 760. The geometric figures may then be dragged within the layout at shown at 770.

Figure 8:
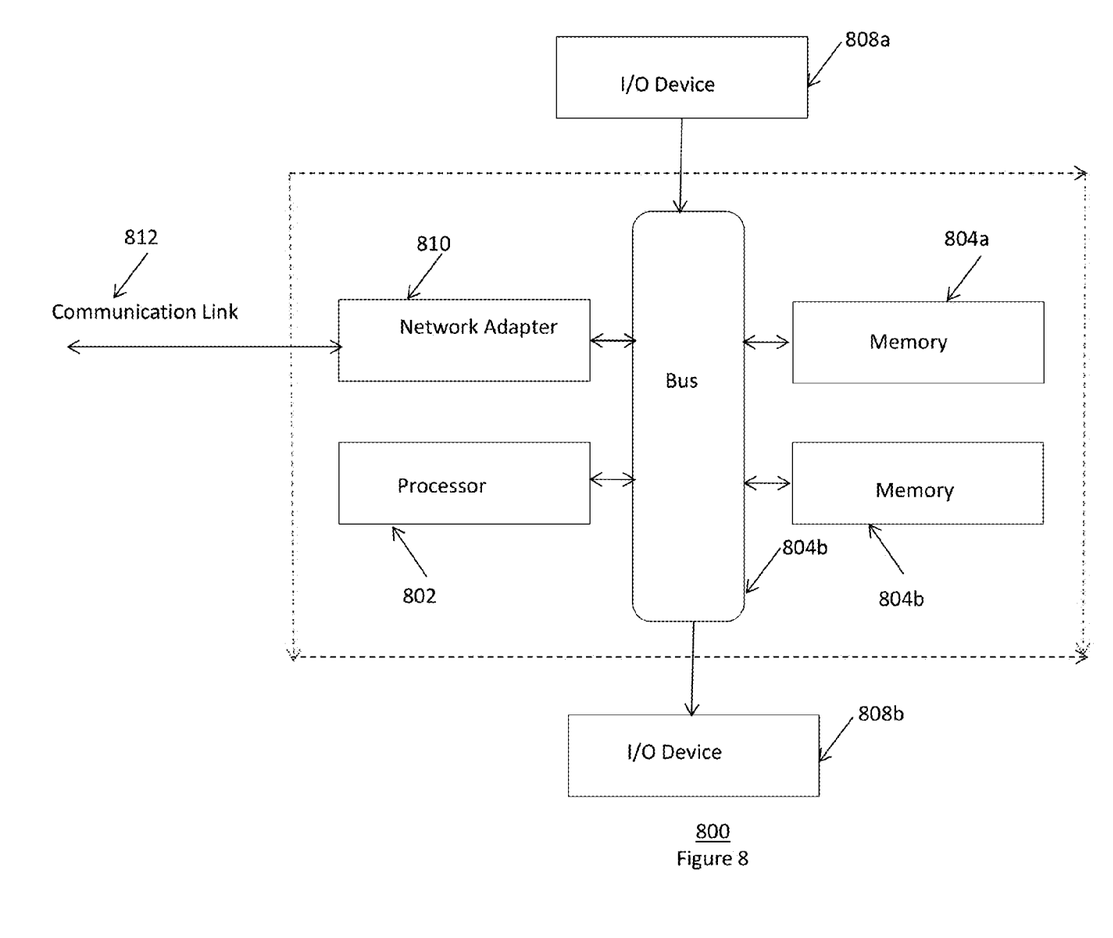
FIG. 8 illustrates a data processing system suitable for storing the computer program product and/or executing program code in accordance with an embodiment of the present invention.

FIG. 8 illustrates a data processing system 800 suitable for storing the computer program product and/or executing program code in accordance with an embodiment of the present invention. The data processing system 800 includes a processor 802 coupled to memory elements 804*a-b* through a system bus 806. In other embodiments, the data processing system 800 may include more than one processor and each processor may be coupled directly or indirectly to one or more memory elements through a system bus.

Memory elements 804*a-b* can include local memory employed during actual execution of the program code, bulk storage, and cache memories that provide temporary storage of at least some program code in order to reduce the number of times the code must be retrieved from bulk storage during execution. As shown, input/output or I/O devices 808*a-b* (including, but not limited to, keyboards, displays, pointing devices, etc.) are coupled to the data processing system 800. I/O devices 908*a-b* may be coupled to the data processing system 800 directly or indirectly through intervening I/O controllers (not shown).

In FIG. 8, a network adapter 810 is coupled to the data processing system 802 to enable data processing system 802 to become coupled to other data processing systems or remote printers or storage devices through communication link 812. Communication link 812 can be a private or public network. Modems, cable modems, and Ethernet cards are just a few of the currently available types of network adapters.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow.

Although the present invention has been described in accordance with the embodiments shown, one of ordinary skill in the art will readily recognize that there could be variations to the embodiments and those variations would be within the spirit and scope of the present invention, such as the inclusion of circuits, electronic devices, control systems, and other electronic and processing equipment. Accordingly, many modifications may be made by one of ordinary skill in the art without departing from the spirit and scope of the appended claims. Many other embodiments of the present invention are also envisioned.

What is claimed is:

1. A computer-implemented method for utilizing a computer to define an instance master to be displayed having a geometrically accurate boundary box, the computer-implemented comprising:
    identifying, by the computer, an instance master to be displayed from a data source;
    determining, by the computer, a boundary box having a plurality of boundary edges defining a geometric boundary of the instance master; and
    determining, by the computer, an instance master halo consisting of one or more geometric figures that are within and proximate to the plurality of boundary edges of the boundary box based upon a predetermined halo width.

2. The computer-implemented method of claim 1, wherein the instance master is moved by dragging the instance master.

3. The computer-implemented method of claim 1, wherein the data source is a data repository.

4. The computer-implemented method of claim 1, wherein the one or more geometric figures includes one or more instance master pins that comprise any of a schematic pin, a symbol pin, a pin to an geometric figure, and a user-predetermined pin.

5. The computer-implemented method of claim 1, wherein the one or more geometric figures proximate to the plurality of boundary edges of the boundary box is predetermined by one or more user-defined parameters.

6. The computer implemented method of claim 5, wherein the one or more user-defined parameters include any of a distance from edge of boundary box, type of geometric figure to be included, total number of geometric figures to be included, number of geometric figures to be dragged, maximum image size, and maximum amount of processing power to use.

7. The computer-implemented method of claim 1, wherein the one or more geometric figures proximate to the plurality of boundary edges of the boundary box includes at least one hundred objects.

8. A computer-implemented method for utilizing a computer to display an instance master having a geometrically accurate boundary box, the computer-implemented method comprising:
    sourcing, by the computer, an instance master from a data source file;
    defining, by the computer, an instance master boundary box in relation to a geometric boundary of the instance master;
    identifying, by the computer, limited content of the instance master in relation to one or more user-defined characteristics including a master set of geometric figures within and proximate to the instance master boundary box using an instance master halo with a predetermined halo width; and,
    displaying, by the computer, the instance master boundary box inclusive of the limited content.

9. The computer-implemented method of claim 8, wherein the instance master is electronically moved by dragging the instance master.

10. The computer-implemented method of claim 8, wherein the data source file is an electronic file.

11. The computer-implemented method of claim 8, wherein the one or more geometric figures includes one or more instance master pins that comprise any of a schematic pin, a symbol pin, a pin to an geometric figure, and a user-predetermined pin.

12. The computer-implemented method of claim 8, wherein the one or more user-defined characteristics include any of a distance from edge of boundary box, type of geometric figure to be included, total number of geometric figures to be included, number of geometric figures to be dragged, maximum image size, and maximum amount of processing power to use.

13. The computer-implemented method of claim 8, wherein the master set of geometric figures proximate to the instance master boundary box includes at least seventy-five geometric figures.

14. A system comprising: one or more computers; and a non-transitory computer-readable medium coupled to the one or more computers having instructions stored thereon which, when executed by the one or more computers, cause the one or more computers to perform operations for defining an instance master to be electronically displayable and movable having a geometrically accurate boundary box and one or more instance master geometric figures proximate to one or more boundary edges of the boundary box, the operations comprising:
    identifying an instance master to be displayed from a data source;
    determining a boundary box having a plurality of boundary edges defining a geometric boundary of the instance master; and
    determining an instance master halo consisting of one or more geometric figures that are within and proximate to the plurality of boundary edges of the boundary box based upon a predetermined halo width.

15. The system of claim 14, wherein the instance master is moved by dragging the instance master.

16. The system of claim 14, wherein the data source is a data repository.

17. The system of claim 14, wherein the one or more geometric figures includes one or more instance master pins that comprise any of a schematic pin, a symbol pin, a pin to an geometric figure, and a user-predetermined pin.

18. The system of claim 14, wherein the one or more geometric figures proximate to the plurality of boundary edges of the boundary box is predetermined by one or more user-defined parameters.

19. The system of claim 18, wherein the one or more user-defined parameters include any of a distance from edge of boundary box, type of geometric figure to be included, total number of geometric figures to be included, number of geometric figures to be dragged, maximum image size, and maximum amount of processing power to use.

* * * * *